(12) United States Patent
Dmitriev

(10) Patent No.: US 10,114,294 B2
(45) Date of Patent: Oct. 30, 2018

(54) APPARATUS AND METHOD FOR IMPARTING DIRECTION-SELECTIVE LIGHT ATTENUATION

(71) Applicant: Carl Zeiss SMS Ltd., Karmiel (IL)

(72) Inventor: Vladimir Dmitriev, Moran (IL)

(73) Assignee: Carl Zeiss SMS Ltd., Karmiel (IL)

( * ) Notice: Subject to any disclaimer, the term of this patent is extended or adjusted under 35 U.S.C. 154(b) by 0 days.

(21) Appl. No.: 15/453,337

(22) Filed: Mar. 8, 2017

(65) Prior Publication Data

US 2017/0176866 A1    Jun. 22, 2017

Related U.S. Application Data

(63) Continuation of application No. PCT/IL2015/050927, filed on Sep. 10, 2015.

(30) Foreign Application Priority Data

Sep. 15, 2014  (IL) .......................................... 234655

(51) Int. Cl.
 *G03B 27/32*  (2006.01)
 *G03B 27/54*  (2006.01)
 (Continued)

(52) U.S. Cl.
 CPC ............ *G03F 7/70125* (2013.01); *G03F 1/38* (2013.01); *G03F 1/50* (2013.01); *G03F 1/60* (2013.01);
 (Continued)

(58) Field of Classification Search
 CPC ..... G03F 1/38; G03F 1/50; G03F 1/60; G03F 1/70; G03F 1/72; G03F 7/70125; G03F 7/70133; G03F 7/70191; G03F 7/70283; G03F 7/70325; G03F 7/7055
 USPC .............................. 355/53, 67, 71, 77; 430/5
 See application file for complete search history.

(56) References Cited

U.S. PATENT DOCUMENTS 4,902,899 A * 2/1990 Lin ....................... G03F 7/2002
 250/492.1
5,789,119 A * 8/1998 Okino ....................... G03F 1/20
 430/5
(Continued)

FOREIGN PATENT DOCUMENTS

KR    10-0791005    1/2008 ........... H01L 21/027
KR    10-2010-0081831    7/2010 ............... G03F 1/08

OTHER PUBLICATIONS

The International Search Report and Written Opinion of the International Searching Authority for International Application No. PCT/IL2015/050927 dated Mar. 23, 2016 (12 pages).
(Continued)

*Primary Examiner* — Colin Kreutzer
(74) *Attorney, Agent, or Firm* — Fish & Richardson P.C.

(57) ABSTRACT

Method, apparatus for imparting direction-selective light attenuation. A method for imparting direction-selective light attenuation to a photomask may include assigning different attenuation levels to light rays of different directions of incidence. The method may also include computing an array of shading elements to attenuate the light rays with the assigned different attenuation levels, depending on the direction of incidence of the light rays. The method may further include inscribing the array of shading elements within a substrate of the photomask.

36 Claims, 13 Drawing Sheets

(51) Int. Cl.
*G03B 27/72* (2006.01)
*G03F 1/00* (2012.01)
*G03F 7/20* (2006.01)
*G03F 1/38* (2012.01)
*G03F 1/70* (2012.01)
*G03F 1/60* (2012.01)
*G03F 1/72* (2012.01)
*G03F 1/50* (2012.01)

(52) U.S. Cl.
CPC ............... *G03F 1/70* (2013.01); *G03F 1/72* (2013.01); *G03F 7/7055* (2013.01); *G03F 7/70191* (2013.01); *G03F 7/70283* (2013.01); *G03F 7/70325* (2013.01)

(56) References Cited

U.S. PATENT DOCUMENTS

| | | | |
|---|---|---|---|
| 7,630,079 | B2 | 12/2009 | Bae et al. |
| 8,007,963 | B2 | 8/2011 | Lee et al. |
| 2003/0157415 | A1* | 8/2003 | Ziger ............... G03F 7/70191 430/5 |
| 2004/0214094 | A1* | 10/2004 | Kim ............... G02B 5/1871 430/5 |
| 2006/0019174 | A1* | 1/2006 | Ahn ............... G03F 7/70433 430/5 |
| 2006/0234139 | A1 | 10/2006 | Watson et al. |
| 2007/0065732 | A1* | 3/2007 | Lee ............... B82Y 10/00 430/5 |
| 2008/0130002 | A1 | 6/2008 | Bae et al. |
| 2009/0191475 | A1* | 7/2009 | Lee ............... B82Y 10/00 430/5 |
| 2010/0173230 | A1 | 7/2010 | Lee et al. |
| 2011/0096979 | A1 | 4/2011 | Lee et al. |
| 2012/0100468 | A1* | 4/2012 | Lee ............... G03F 1/54 430/5 |
| 2015/0037714 | A1 | 2/2015 | Cai |

OTHER PUBLICATIONS

Korean Office Action for Korean Application No. 10-2017-7008786 dated May 9, 2018 (20 pages).

* cited by examiner

100

```
┌─────────────────────────────────────────────────┐
│  Assign different attenuation levels to light rays │
│       of different directions of incidence         │
│                      102                           │
└─────────────────────────────────────────────────┘
                        │
                        ▼
┌─────────────────────────────────────────────────┐
│ Compute an array of shading elements to attenuate the light │
│    rays with the assigned different attenuation levels,     │
│   depending on the direction of incidence of the light rays │
│                          104                                │
└─────────────────────────────────────────────────┘
                        │
                        ▼
┌─────────────────────────────────────────────────┐
│ Inscribe the array of shading elements within a substrate of │
│                    the photomask                             │
│                         106                                  │
└─────────────────────────────────────────────────┘
```

Fig. 1

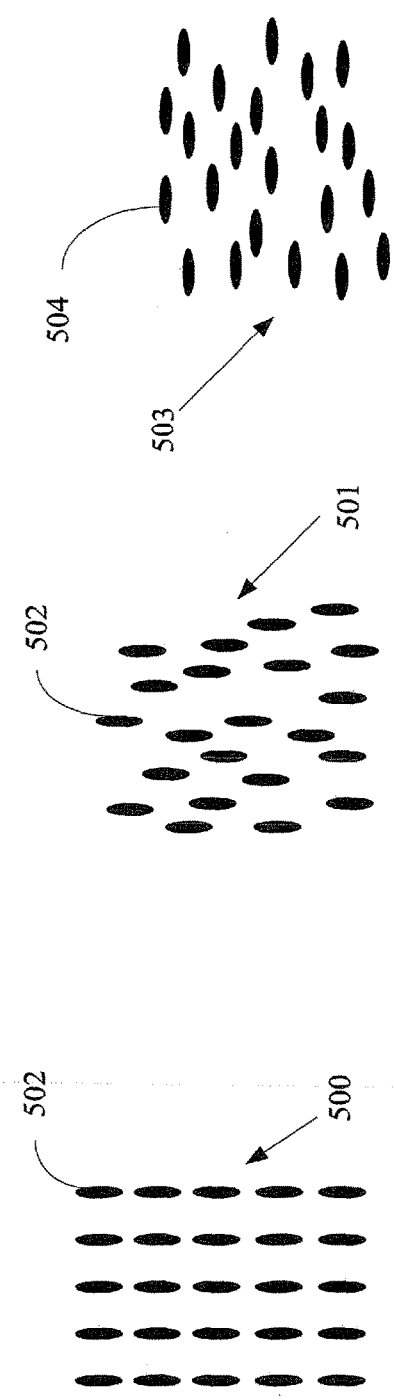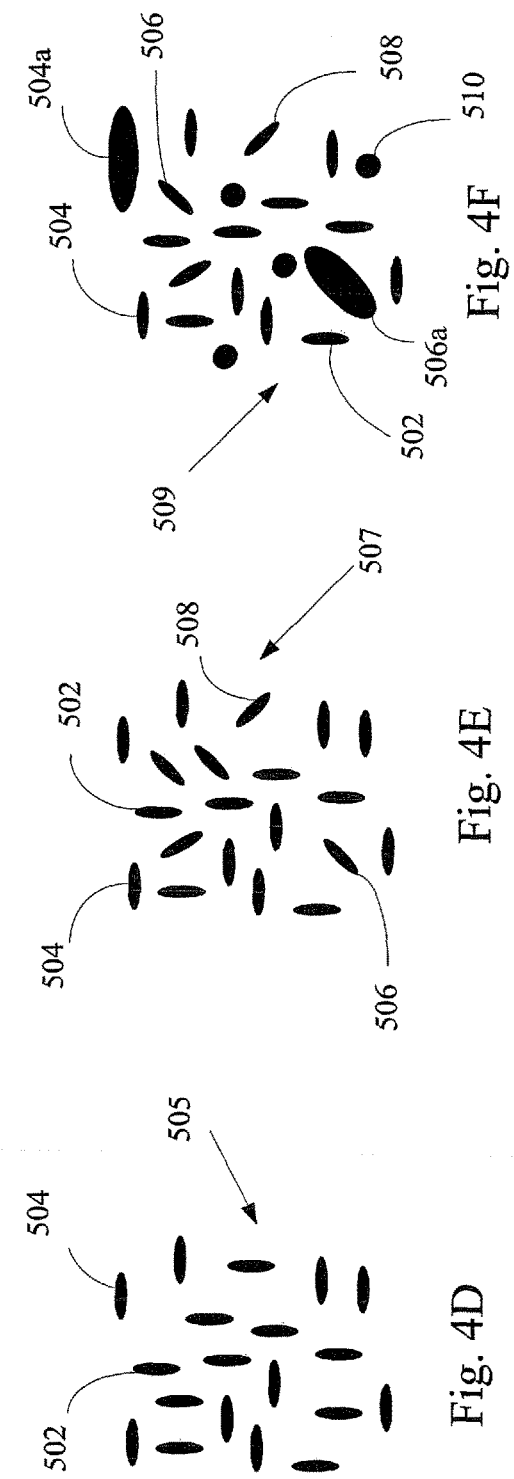
Fig. 4A  Fig. 4B  Fig. 4C
Fig. 4D  Fig. 4E  Fig. 4F

APPARATUS AND METHOD FOR IMPARTING DIRECTION-SELECTIVE LIGHT ATTENUATION

CROSS-REFERENCE TO RELATED APPLICATION

This application is a continuation of International Application PCT/IL2015/050927, having a filing date of Sep. 10, 2015, which claims priority to Israel patent application 234655, filed on Sep. 15, 2014. The entire contents of the above applications are hereby incorporated by reference.

TECHNICAL FIELD

The present invention relates generally to fine light control for the lithographic process. More specifically, the present invention relates to apparatus and method for making a direction-selective light attenuator and a direction-selective light attenuator thereof. Embodiments of the present invention are described with respect to imparting direction-selective light attenuation to a photomask.

BACKGROUND

With the advance of photolithography techniques, the features of patterns written on the photoresist layer of a substrate become increasingly smaller.

The ability to project a clear and fine pattern of small details onto a wafer in the photolithographic process is limited by the wavelength of the irradiation used, and the ability of the reduction optics to capture enough diffraction orders from the illuminated mask (affected by the numerical aperture of the optical lens used).

Variations in the critical dimensions (CD)—that is, variations in the feature sizes on the manufactured wafer, with respect to their expected values may impair the process window and the yield.

Various techniques were introduced to overcome variations in CD. For example, optimizing the exposure dose of the irradiation directed on the photomask, to better match between the expected CD and the actual CD of different parts of the resulting pattern on the wafer.

Another way of dealing with CD variations involves planting shading elements in specific positions within the photomask substrate, above the pattern parts with variable optical density.

SUMMARY

According to some embodiments there is provided a method for imparting direction-selective light attenuation to a photomask. The method may include assigning different attenuation levels to light rays of different directions of incidence. The method may also include computing an array of shading elements to attenuate the light rays with the assigned different attenuation levels, depending on the direction of incidence of the light rays. The method may further include inscribing the array of shading elements within a substrate of the photomask.

In some embodiments, the different directions of incidence may comprise different azimuthal directions.

In some embodiments, the different directions of incidence may comprise different angles of incidence.

In some embodiments of the present invention the array of shading elements may be designed to present different scattering cross section to the incident rays of light of different directions.

In some embodiments of the present invention one or a plurality of characteristics of the array of shading elements locally varies across the array of shading elements.

In some embodiments the one or a plurality of characteristics of the array of shading elements may be selected from the group of characteristics consisting of pixel size, shape, pixel orientation, pixel density of the array, and arrangement of the shading elements in the array. "Pixel", in the context of the present specification, usually refers to an element of the array of shading elements.

According to some embodiments the array of shading elements may include at least two shifted substantially parallel two-dimensional formations of shading elements.

In some embodiments the at least two shifted substantially parallel two-dimensional formations of shading elements may include three two-dimensional formations of shading elements.

In some embodiments the three two-dimensional formations of shading elements may include two external two-dimensional formations of shading elements and a third two-dimensional formation of shading elements in between the external formations, and the two external formations may substantially be aligned whereas the third formation may be shifter with respect to the two external formations.

According to some embodiments of the invention the at least two shifted substantially parallel two-dimensional formations of shading elements may be shifted with respect to each other.

In some embodiments the shading elements of the two-dimensional formations may be substantially asymmetrical.

In some embodiments, some or all of the shading elements of the array of shading elements may be positioned within 40 to 100 microns from a patterned coating layer on the substrate.

According to some embodiments of the present invention there is provided an apparatus for imparting direction-selective light attenuation to a photomask. The apparatus may include a laser source; a beam delivery system and focusing optics; and a control unit configured to, using the laser source, beam delivery system and focusing optics, inscribing an array of shading elements within a substrate of the photomask, wherein the array of shading elements is configured to attenuate the light rays in different attenuation levels, depending on the direction of incidence of the light rays.

In some embodiments there is provided a photomask that includes a transparent substrate with an array of shading elements within the substrate, wherein each of the elements may be configured to selectively attenuate light rays in different attenuation levels, depending on the direction of incidence of the light rays.

DESCRIPTION OF DRAWINGS

In order to better understand the present invention, and appreciate its practical applications, the following Figures are provided and referenced hereafter. It should be noted that the Figures are given as examples only and in no way limit the scope of the invention. Like components are denoted by like reference numerals.

FIG. 1 illustrates a method for selective attenuation of light propagating through a patterned photomask, according to some embodiments of the present invention.

FIG. 4A illustrates a top-view periodic two-dimensional arrangement for an array of shading elements, according to some embodiments of the present invention.

FIG. 4B illustrates a top-view non-periodic two-dimensional arrangement for an array of shading elements, according to some embodiments of the present invention.

FIG. 4C illustrates a top-view non-periodic two-dimensional arrangement for an array of shading elements, according to some embodiments of the present invention, which is the same arrangement of the array of FIG. 4B but rotated (90 degrees).

FIG. 4D illustrates a top-view non-periodic two-dimensional arrangement for an array of shading elements, according to some embodiments of the present invention, with shaped pixels of two orthogonal orientations.

FIG. 4E illustrates a top-view non-periodic two-dimensional arrangement for an array of shading elements, according to some embodiments of the present invention, with shaped pixels of different orientations.

FIG. 4F illustrates a top-view non-periodic two-dimensional arrangement for an array of shading elements, according to some embodiments of the present invention, with shaped pixels of different shapes, sizes and/or orientations.

Figure 2:
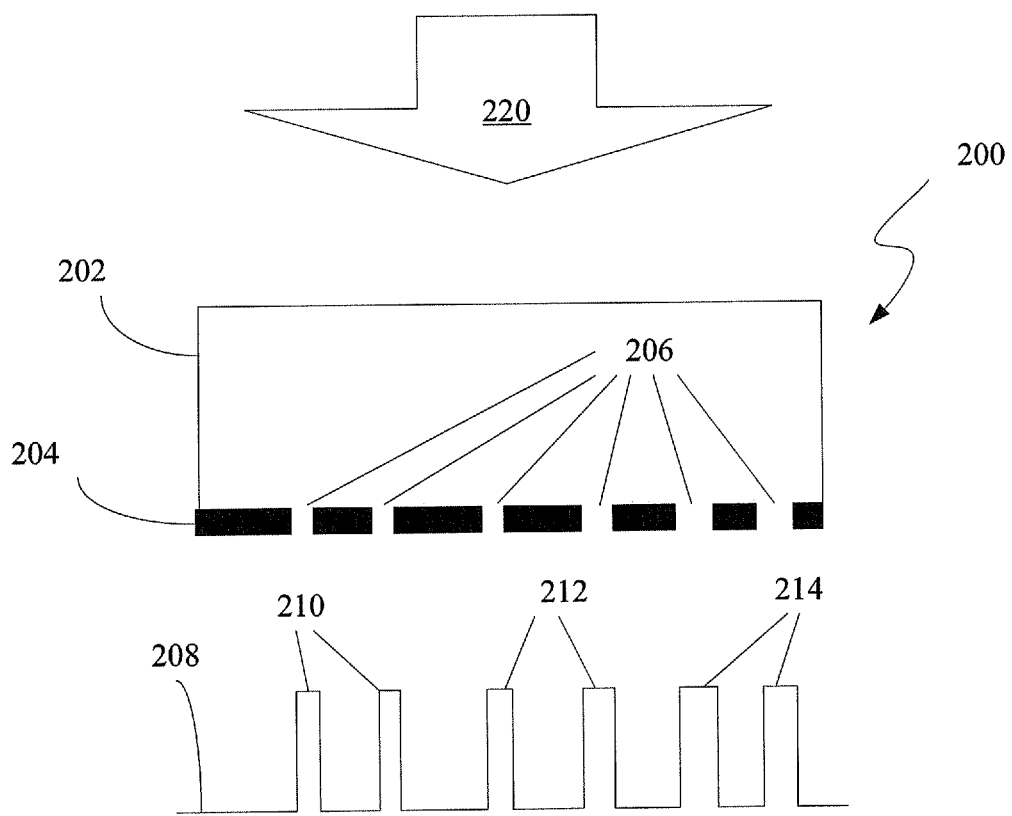
FIG. 2 illustrates CD variations across a wafer exposure field of a photomask.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the methods and apparatus. However, it will be understood by those skilled in the art that the present methods and apparatus may be practiced without these specific details. In other instances, well-known methods, procedures, and components have not been described in detail so as not to obscure the present methods and apparatus.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

While embodiments of the present invention are mainly described hereinafter with respect to light attenuation in photomasks, it is noted that other applications of the invention are possible, which are not related to photomasks. Thus the present invention should not be understood to be only related to or limited to photomasks.

Photomasks (sometimes also referred to as "reticles") used in the manufacturing of integrated circuits (IC) are composed of a Chromium layer deposited on Quartz or fused Silica plates, which are subsequently patterned for use as a "negative", similarly to the printing process in traditional photography, in a photolithographic process.

In a photolithographic process, ultraviolet (UV) light passes through the pattern inscribed on the Chromium layer of the photomask, and an image is formed within the photo-resist layer on top of a Silicon wafer. In some cases, the pattern on phase shift photomasks is inscribed on a chromium oxide ($Cr_2O_3$), chromium nitride (CrN) or molybdenum silicide (MoSi) layer.

Additional layers, like protective layers, antireflective layers, or an embedded phase-shifting layer, such as MoSi, occasionally may accompany the chrome layer.

Additional applications similar to IC are the lithographic processes for thin film magnetic read/write heads used in hard disk drives for data storage.

Front-end IC processes require sub-micron resolution, typically with an optical demagnification (reduction) factor of 1:4 from a mask object to the printed image on the Silicon wafers.

Such sub-micron processes require that critical dimensions (CD) of the features printed on the wafer be uniform, with strict specifications.

However, it is well known throughout the semiconductor industry that the lithography process is prone to CD variations, which often exceed specifications and requirements.

Not all CD variations are inherent to the homogeneity of the patterning on the photomask itself. In fact, a large proportion of CD variations may be attributed to external causes, such as, for example, the optical set-up used in the photolithographic process. There are various sources for CD variations, some of which are lens aberrations, non-uniform patterning on the photomask, illumination design, Photoresist coating and development, etching processes and others.

Thorough studies of CD variations have shown that variations are in most cases, segmented to specific areas of the exposure field. An exposure field is equivalent to one projection of the mask on the wafer, hence a single wafer contains many exposure fields of the same mask. A good statistical model can specify numbers of percent of CD deviations for each area.

CD variations may be improved by taking an advantage of the fact that photo-resist threshold for activation, varies linearly with the logarithm of the exposure dose, with a constant slope.

If variations are a few percent above a specified value, a reduction in the UV irradiation dose, will change the CD value, such as the printed line width (or contact-holes diameter) and will bring it closer to the required value.

One possible way of applying a dose reduction pattern to a photomask, on its back-side, is by patterning grooves or holes on the back-side surface of the mask.

However, such a method is limited in its dynamic range, the process is slow, and suffers from high equipment cost.

There are other methods for CD control, which are commonly used in the semiconductors industry, like the focus/exposure (dose) process-window optimization, which determines the average CD on wafers. However, such methods are generally not suitable for controlling CD variations within and across the exposure fields on the wafer (Intra field CD variations).

Other methods for CD control include, for example, Dosicom—dose control along scanner slit motion, and Unicom—dose control across the slit. Such methods do not allow high spatial resolution of the dose control and are capable for correction of the CD variation portion that can be factorized in, along and across slit directions.

It was previously demonstrated that laser-inscribed shading elements may be provided within the substrate of a photomask in regions that correlate to regions of the wafer exposure field where CD variations are greater than a predetermined target value, may attenuate irradiation dose locally, so as to compensate for the CD variations in the appropriate regions of the wafer exposure field.

The shading elements form correction patterns across the correlating regions of the photomask substrate and include arrays of pixels, each array extending across one of the regions. For many purposes the pixel arrays are two dimensional, formed in a single layer at the designated correction sites. A "shading element", in the context of the present specification may refer to one or a group of pixels that form an array element of the array of shading elements, as described, for example, with respect to various embodiments of the present invention, hereinafter.

Often, a photomask includes features of different CD profiles (hereinafter—CD features). Thus, when applying CD correction (CDC) that constitutes irradiation attenuation, which is provided uniformly in various locations across the exposure fields of the wafer, there is an inevitable compromise in the performance of the CDC due to the different CD variation profiles.

It was suggested in the past to provide arrays of shading elements with predetermined pixel size, predetermined lateral size, density of pixels, number of layers and the resulting shading level, to compensating for CD variations across the exposure fields of the photomask.

Some embodiments of the present invention are directed at selectively attenuating light rays having different azimuthal directions but same angle of incidence.

Other embodiments of the present invention are directed at selectively attenuating light rays having different angle of incidence.

FIG. 1 illustrates a method 100 for imparting direction-selective light attenuation to a photomask, according to some embodiments of the present invention. Method 100 may include assigning 102 different attenuation levels to light rays of different directions of incidence. Method 100 may also include computing 104 an array of shading elements to attenuate the light rays with the assigned different attenuation levels, depending on the direction of incidence of the light rays. Method 100 may also include inscribing 106 the array of shading elements within a substrate of the photomask.

By "rays of directions of incidence" it is generally meant mean, in the context of the present specification to refer to rays of light with different incidence directions with respect to a facing surface of a photomask onto which the rays are directed By "light" it is generally meant to refer to any electromagnetic radiation which is used in connection with a photomask.

According to some embodiments of the present invention, in computing the array of shading elements various pixel and shading element arrays designs may be considered, some of which are described hereinafter.

By "computing" is meant, in the context of the present invention determining by calculation, and in particular automated calculation (e.g. using a processing unit), of various characteristics and properties relating to the array of shading elements, such as, for example, shape, size, orientation of a shading element of the array of shading elements, position of each of the shading elements, shape, size, coverage, orientation and position of the array of shading elements, etc.

FIG. 2 illustrates CD variations across a wafer exposure field of a photomask. Photomask 200 includes a substrate 202 and a coating layer 204 that includes an inscribed pattern 206. Critical features of the pattern vary, and as a consequence, when light 220 (e.g., ultraviolet-UV-light) is irradiated on the photomask 200 the resulting light pattern emerging from the photomask includes variations in the light peaks—some light peaks 210 are narrow, other light peaks 212 are a bit wider, whereas some other light peaks are much broader 214, instead of presenting uniform widths, had there not been CD variations.

Figure 3A:
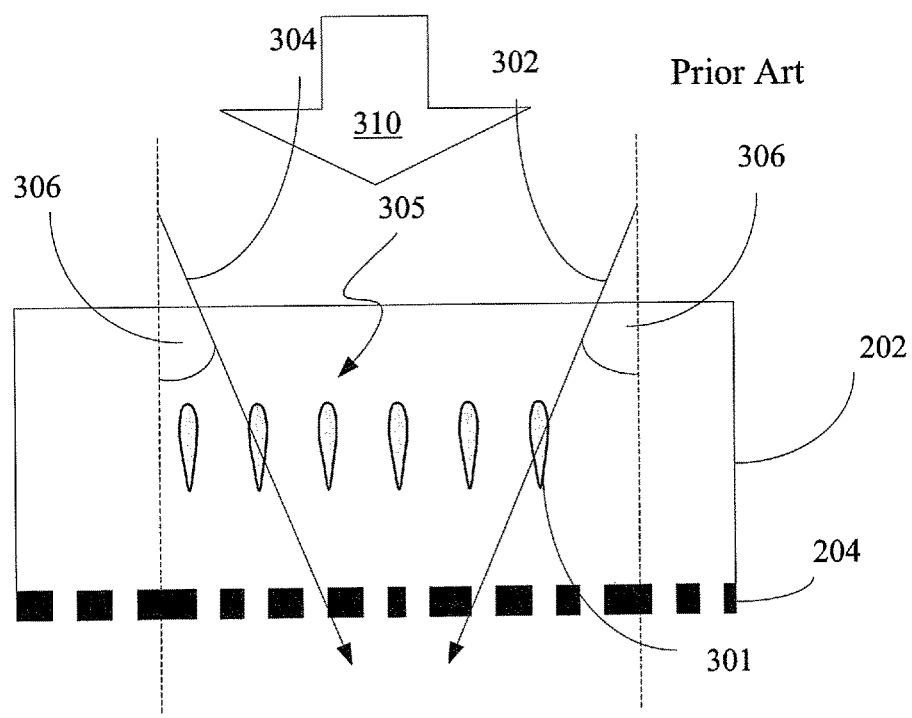
FIG. 3A illustrates the use of shading elements to attenuate light passing through a substrate of photomask (prior art).

FIG. 3A illustrates the use of shading elements to attenuate light passing through a substrate of photomask (prior art). Substrate 202, which is made of fully or partially transparent material (for light of designated optical characteristics, e.g., designated wavelength), includes an array 305 of shading elements 301. The patterned coating layer is not shown for brevity, but would typically be located at the bottom of the substrate. The shading elements 301 are, according to some embodiments of the present invention, pixels written inside the substrate, for example by a laser beam (e.g., femtosecond laser beam) that is focused in the designated location for each pixel, causing damage at that location that results in a change of the refractive index and transparency of the substrate at the designated location of that pixel. The shape of the pixel shown in this figure is elongated in the form of a tear, although in reality it has a somewhat more complex shape. Shown in the figure is only a single row of shading elements, but typically the array of shading elements is arranged in a two-dimensional formation of shading elements 301, defining periodic structure of rows and columns. In some other embodiments, for example, the array of shading elements is arranged in a two-dimensional formation of shading elements, defining aperiodic pseudo random structure or spatial spectrum free structures.

The shading elements (pixels) may be designed for CDC purposes or for other purposes. For example, typically, shading elements for CDC are produced by a focused laser beam of relatively low energy, and are axially symmetrical. The aspect ratio between the length and width ratio of such shading elements is typically small. As a result, such shading elements would induce minimal expansion of the substrate material at the designated location of the pixel at a given level of light attenuation In other embodiments of the present invention, when planting pixels in a substrate for registration/overlay control, such pixels are typically generated using a laser beam of a higher energy than the energy used for generating shading elements for photomasks. Their shape is typically longer than pixels for CDC, their aspect ratio is greater and they cause expansion of the substrate volume in which they are embedded. Expansion (in some cases compaction) is a result of substrate morphology change induced by the light irradiating these pixels. In addition, the generating laser beam may be shaped to obtain pixels of specific shapes in order to achieve asymmetrical expansion.

Light beam 310 (e.g., UV light) is irradiated in general direction (indicated by the arrow) onto substrate 202 of the photomask. The incoming light beam is treated so as to allow only light rays of selected directions of incidence to reach the photomask, for example, light rays 302 and 304, which are coplanar and have different azimuthal directions (as indicated by the arrow heads of light rays 302 and 304) with respect to the substrate 202, but have the same angle of incidence 306 (measured with respect to a perpendicular—the dashed line—also referred to as surface normal or normal)—to the lateral dimension of the array of shading elements. There are various known ways of illumination control. Usually in microlithography a high level of field uniformity is desired, and the distribution of pupil illumination is controlled. A simple way is to us an attenuation mask that blocks all rays in undesired directions in the conjugate pupil plane, but this leads to a big loss of the light and hence decreases scanner throughput. Alternative way is a kind of a diffractive optical element (DOE) that splits a bundle of rays coming from a light source to a plurality rays of specific directions as required.

It is evident that most of the light rays (not shown in this figure) which are perpendicular to the lateral dimension of the array of shading elements do not interact with, or are hardly affected by the shading elements, which results with negligible or no attenuation. On the other hand, light rays with an angle of incidence with respect to the perpendicular to the array of the shading elements, such as, for example, light rays 302 and 304, are affected by the shading elements, resulting in attenuation of these light rays.

Figure 3B:
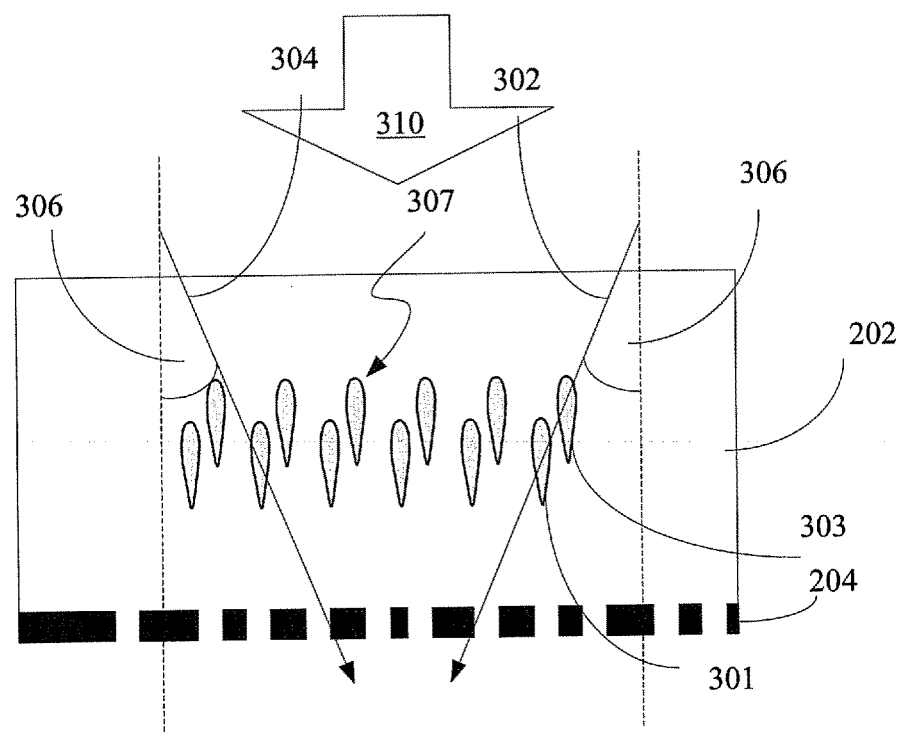
FIG. 3B illustrates a substrate of a photomask with an array of shading elements for direction-selective attenuation of light passing through the photomask, according to some embodiments of the present invention.

FIG. 3B illustrates a substrate of a photomask with an array 307 of shading elements for direction-selective attenuation of light passing through the photomask, according to some embodiments of the present invention.

The array 307 of shading elements, in the example shown in this figure, includes two shifted two-dimensional formations 301 and 303 of substantially symmetrical shading elements (pixels), the symmetry of which is about the longitudinal axis of each shading element. Shown in the figure is only a single row of each formation of shading elements, but typically each formation of the array of shading elements is arranged in a two-dimensional arrangement of shading elements 301. By "shifted" is meant, in the context of the present specification, that shading elements of one two-dimensional formation of shading elements is slightly offset with respect to shading elements of the other two-dimensional formation. "Slightly" means that the shift is smaller than the distance between two adjacent shading elements of the same formation. The shift does actually depend on the angle of the light ray one would like to shade less. In the modern scanner maximum illumination angle at the wafer is given by NAwafer=sin(angle)=1.35, where "NA" is the numerical aperture, and "angle" is the illumination angle. At the mask level it is 4 times less and NAmask=NAwafer/4=0.34. In the glass NAglass=NAmask/R=0.22 (where R is fused silica refractive index ~1.5 at the working wavelength). This is the maximum angle but typically the illumination angle that is somewhat smaller, say 0.2 for the typical illumination dipole. So in this case the angle to the correspondent pixel has to be sin(angle)=0.2→angle is ~0.2*180/3.141592=11°). In embodiments of the present invention where the shading elements in a row of each formation are separated by equal distances—said to be presenting a constant phase, the shift is said to be smaller than that phase.

Most of the light rays of the light 310 irradiated onto the substrate 202, which are perpendicular to the lateral dimension of the array of shading elements do not interact with, or are hardly affected by the shading elements, which results with negligible or no attenuation. On the other hand, light rays with an angle of incidence with respect to the perpendicular to the array of the shading elements, such as, for example, light rays 302 and 304, are affected by the shading elements, resulting in attenuation of these light rays. However, as opposed to the situation depicted in FIG. 3A, the arrangement of array 307 of shading elements causes different effects on rays 302 and 304.

Ray 302 and ray 304 are substantially mutually coplanar and also substantially coplanar with the two rows of shading elements 301 and 303 of array 307.

Due to the asymmetrical arrangement, ray 304 is affected to a lesser extent than ray 302. While ray 304 is scattered by a single shading element of the formation of shading elements 301, ray 302 is scattered by two shading elements—a single shading element of the formation of shading elements 301 and a single shading element of the formation of shading elements 303. This causes ray 302 to be more attenuated that ray 304. Thus a direction-selective attenuation of light is obtained, where light rays in a specific direction and angle of incidence are attenuated more than other rays that are coplanar to these light rays, and also coplanar with a row of shading elements of each of the formations of shading elements that make the array of shading elements.

Figure 3C:
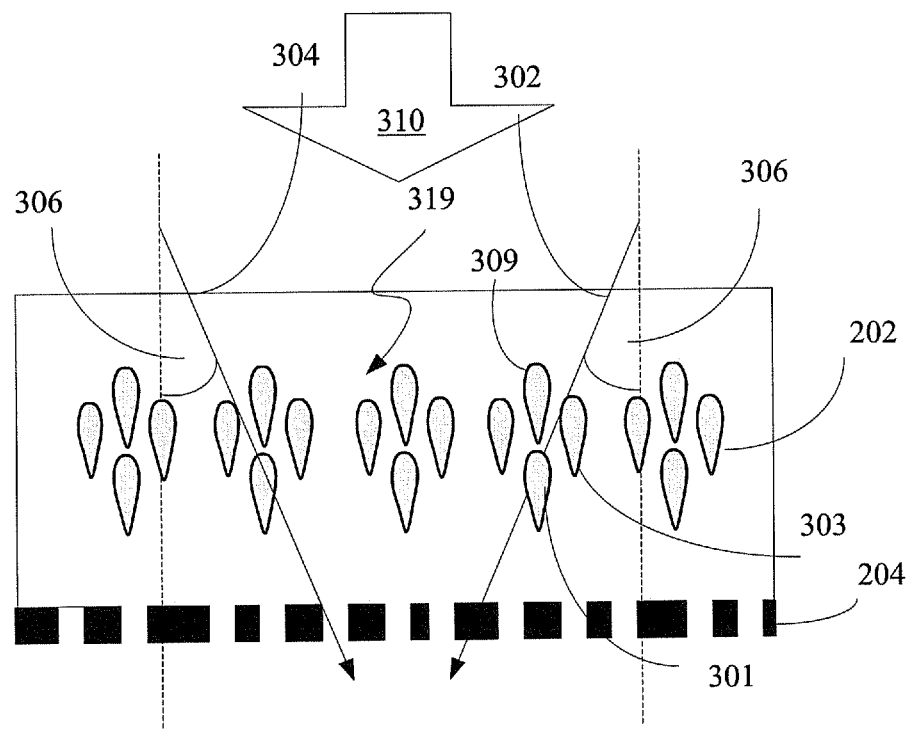
FIG. 3C illustrates a substrate of a photomask with an array of shading elements for direction-selective attenuation of light passing through the photomask, according to some other embodiments of the present invention.

FIG. 3C illustrates a substrate of a photomask with an array 307 of shading elements for direction-selective attenuation of light passing through the photomask, according to some other embodiments of the present invention. Here the array 319 of shading elements includes three shading elements formations 301, 303 and 309, where formations 301 and 309 are substantially horizontally aligned whereas formation 303 includes a row of pixel pairs offset with respect to the corresponding positions of the pixels of formations 301 and 309. This arrangement causes rays 302 and 304, which are mutually coplanar and also coplanar with corresponding rows of the array of shading elements, to be similarly attenuated due to the symmetrical arrangement of the shading elements that induces similar scattering effect (in different directions through) and hence same attenuation.

Figure 3D:
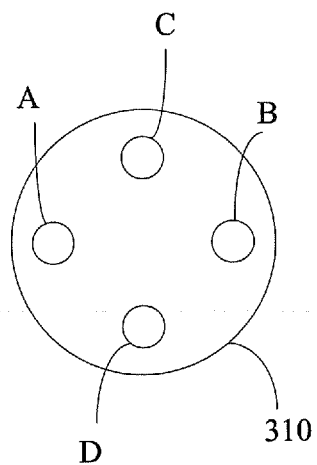
FIG. 3D illustrates a pupil plane of a light beam directed onto a direction-selective light attenuator, specifically indicating four rays having the same angle of incidence but coming from different directions with respect to the array of shading elements, according to some embodiments of the present invention.

FIG. 3D illustrates a pupil plane of a light beam 310 directed onto a direction-selective light attenuator, specifically indicating four rays having the same angle of incidence but coming from azimuthal different directions with respect to the array of shading elements, according to some embodiments of the present invention.

Some rays in beam 310, e.g., A, B, C, D, have the same angle of incidence with respect to the array of shading elements but come from different directions. Rays A and B correspond to rays 304 and 302 (see FIGS. 3A, 3B and 3C) respectively, which are mutually coplanar and also coplanar with the row of shading elements of the shading elements formation 301, see FIG. 3A, or of formations 301, 303 and 309—see FIGS. 3B and 3D—of the array of shading elements in the substrate. Rays C and D are also mutually coplanar, but are not coplanar with the row of shading elements of the shading elements formation 301 (or of formations 301, 303 and 309) of the array of shading elements in the substrate.

The attenuation effect of each of the arrangements of the shading elements array, as depicted in FIGS. 3A, 3B and 3C are as follows:

The shading elements array of FIG. 3A would have the same effect on all rays A, B, C and D, (not depicted on picture, see FIG. 3D) as the scattering cross-section of the shading element array across the array is the same for all rays having the same angle of incidence but come from different incidence directions.

The shading elements array of FIG. 3B would have the same effect on rays A, C and D (no or negligible attenuation), but will affect differently ray B, attenuating it to a lower level than the level of rays A, C and D. This is because the scattering cross section of the shading elements array across the array selectively scatters (and thus attenuates) ray B more than it does to rays A, C and D.

The shading element array of FIG. 3C would have the same effect on rays C and D (no or negligible attenuation), but will affect differently rays A and B, attenuating these rays to a lower level than the level of rays C and D. This is because the scattering cross section of the shading elements array across the array selectively scatters (and thus attenuates) rays A and B more than it does to rays C and D.

Sometimes, the light irradiated on a photomask has to include rays of different incidence angles. This is the case, for example, when planning irradiation of a photomask which includes details of different periods, e.g., series of lines, each series of lines with different separating distance between lines.

Figure 3E:
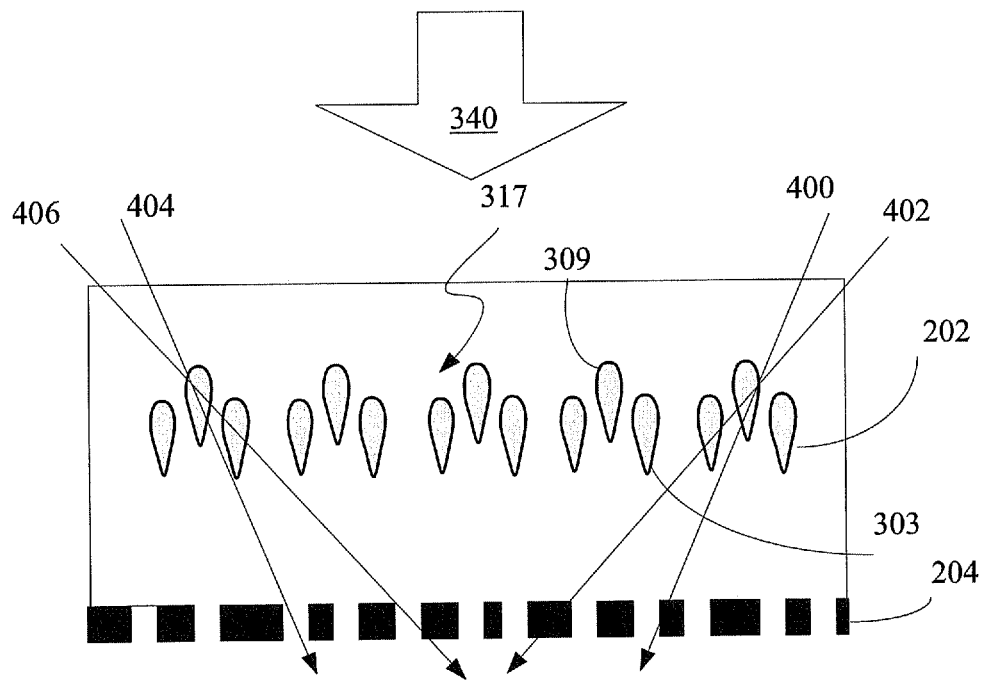
FIG. 3E illustrates a substrate of a photomask with an array 307 of shading elements for direction-selective attenuation of light rays of different azimuthal directions and angles of incidence passing through the photomask, according to some other embodiments of the present invention.

FIG. 3E illustrates a substrate of a photomask with an array 307 of shading elements for direction-selective attenuation of light rays of different azimuthal directions and different angles of incidence passing through the photomask, according to some other embodiments of the present invention. Light beam 340 is treated so as to allow only light rays 400, 402, 404 and 406 to reach the photomask. Here the array 317 of shading elements includes three shading elements formations 303 and 309, where formation 303 includes a row of pixel pairs offset with respect to the corresponding positions of the pixels of formation 309. This arrangement causes rays 400 and 404, which are mutually coplanar and also coplanar with corresponding rows of the array of shading elements, to be similarly attenuated due to the symmetrical arrangement of the shading elements that induces similar scattering effect (in different directions through) and hence same attenuation. Rays 402 and 406, while coplanar with rays 400 and 404 have azimuthal directions and incidence angles which are different than those of rays 400 and 404. Rays 400 and 404 are more affected by the array 317 shading elements, and experience greater attenuation.

Figure 3F:
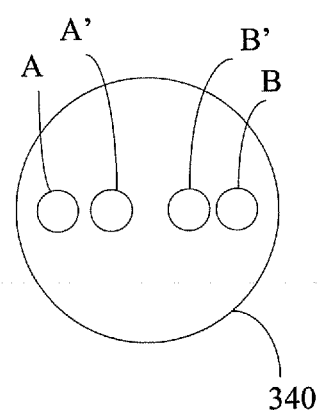
FIG. 3F illustrates a pupil plane of a light beam 340 directed onto a direction-selective light attenuator, for light rays of different azimuthal directions and angles of incidence, according to some embodiments of the present invention.

FIG. 3F illustrates a pupil plane of a light beam 340 directed onto a direction-selective light attenuator, for light rays of different azimuthal directions and angles of incidence, according to some embodiments of the present invention, specifically indicating four rays—two pairs of rays A-B and A'-B', each pair having the same angle of incidence but coming from azimuthal different directions with respect to the array of shading elements. Furthermore, the azimuthal angle of incidence of on pair of rays—A-B—is different than the angle of incidence of the other pair of rays—A'-B'.

The effect of the array of shading elements 317 is to attenuate rays A and B to a certain intensity level and to further attenuate rays A' (corresponding to light ray 404 of FIG. 3E) and B' (corresponding to light ray 400 of FIG. 3E) to a lower intensity level.

A substantial attenuation effect of the shading element array may be achieved for rays which are coplanar with one or a plurality corresponding rows of shading formation or formations of the shading elements, by designing the array of shading elements to present a selective scattering cross section to incident rays of different directions (e.g., a symmetrical or asymmetrical arrangement of shading corresponding elements in one or a plurality of shading elements formations of the array).

According to some embodiments of the present invention, for example, by using a shaped writing beam the shading elements may be produced in various shapes. In some embodiments the pixel may have an axial symmetry. In other embodiments the pixel may have no axial symmetry. Pixels may have elongated size oriented in one or more directions of the XY plane (across the photomask), or in space (three-dimensional). The orientation of pixels may be controlled by varying of a writing beam shape.

In some embodiments one or a plurality of characteristics of the shading elements may locally vary.

By selecting one or more characteristics of the array of shading elements—pixel size, shape, pixel orientation pixel density of the array, and arrangement of the shading elements in the array—it may be possible to selectively control attenuation of the light coming from different azimuthal directions.

Combination of selected characteristics of the array of shading elements, e.g., three-dimensional pixel arrangement with different pixel shape, may provide more degrees of freedom and allows obtaining higher attenuation contrast for different azimuthal directions of the incident light. In most of the cases shading elements written by laser beam are not absorbing the light. Light is scattered over the areas with modified refraction index. When saying that a shading element attenuates a light ray that means that the amount of the light propagating in this ray becomes smaller. In some cases, the secondary light rays resulting from the scattering of the incident light also reach the imaging plane, hence participating in the resulting image formation and therefore should preferably be considered. Another aspect of the shading control originates from the location of the shading elements inside the mask substrate. Light rays coming from different azimuthal directions which are shaded by the same shading element effectively illuminate different pattern locations. At the same time attenuation at one of these locations may also be a result of the shading of another shading element. In case of slow spatial variation of the affected shading this may be ignored. In other cases, one has to solve the problem of the determination of the shading elements distribution that causes required shading at the pattern level.

FIG. 4A illustrates a top-view periodic two-dimensional arrangement for an array of shading elements 500, according to some embodiments of the present invention. "Top-view", in the context of the present specification, refers to the view seen from the general direction of the incident light directed into the substrate of the photomask and onto the inscribed pattern. When using a single layer array of shading elements, selective attenuation that depends on the direction of the incident beams of the light with respect to the array of shading elements, is obtained because of the shape of the pixels 502, which in this example is elongated. Incident light rays which are coplanar with the longitudinal axis of the pixel of the array (the lengthier aspect of the pixel) experience greater attenuation than light rays directed in other directions which are not coplanar with the longitudinal axis of the pixels. Of the latter, light rays which are coplanar with a plane perpendicular to the longitudinal axis of the pixels experience least attenuation. The overall attenuation profile is generally periodic as well, corresponding to the period arrangement of the array of shading elements.

FIG. 4B illustrates a top-view non-periodic two-dimensional arrangement for an array of shading elements 501, according to some embodiments of the present invention. Here the predetermined location of the pixels 502 determines the shading profile of the array. The selectiveness of the attenuation of the pixels in this arrangement is determined by the shape of each pixel FIG. 4C illustrates a top-view non-periodic two-dimensional arrangement for an array of shading elements 503, according to some embodiments of the present invention, which is the same arrangement of the array of FIG. 4B but rotated (90 degrees). The pixels 504 of the array 503 are rotated by 90 degrees with respect to pixels 502 of array 501 (FIG. 4B). Rotating the arrangement causes the profile of the direction-selective attenuation of that array to also rotate with respect to the attenuation profile of the array of FIG. 4B.

FIG. 4D illustrates a top-view non-periodic two-dimensional arrangement for an array of shading elements 505, according to some embodiments of the present invention, with shaped pixels 502 and 504 of two orthogonal orientations. In this arrangement, the direction-selective attenuation affected by the vertically oriented pixels 502 is different than the direction-selective attenuation affected by the horizontally oriented pixels 504. Incident light rays coplanar with the vertical longitudinal axis of pixels 502 of the array experience greater attenuation than light rays directed in other directions which are not coplanar with the vertical axis of pixels 502, whereas incident light rays coplanar with the horizontal longitudinal axis of pixels 504 of the array experience greater attenuation than light rays directed in other directions which are not coplanar with the horizontal axis of pixels 502.

FIG. 4E illustrates a top-view non-periodic two-dimensional arrangement for an array of shading elements 507, according to some embodiments of the present invention, with shaped pixels 502 and 504 of different orientations. In this arrangement, the direction-selective attenuation is affected differently by vertically oriented pixels 502, horizontally oriented pixels 504 and by diagonally oriented pixels 506.

FIG. 4F illustrates a top-view non-periodic two-dimensional arrangement for an array of shading elements 509, according to some embodiments of the present invention, with shaped pixels 502 and 504 of different shapes, sizes and/or orientations. While the direction-selective attenuation is affected differently by vertically oriented pixels 502, horizontally oriented pixels 504 and by diagonally oriented pixels 506, in the manner explained hereinabove. Pixels 510, which are circular, are included so as to provide local non-selective attenuation within the array of shading elements at the location of these circular pixels. Pixels 504a and 506a correspond to pixels 504 and 506 but are different in their sizes. The greater the size of a pixel the greater it affects the attenuation (and scattering) of light.

The pixel shapes and array arrangements illustrated in FIGS. 4A-4F are given as examples only. In accordance with some embodiments of the invention it is possible to select the shape of the pixels and the arrangement of the shading elements as well as other characteristics of the array so as to comply with the direction-selective attenuation profile desired. The pixel and array characteristics may include, for example, pixel size, shape, pixel density in the array, orientation of the pixels and orientation of the array in one, two or three dimensions, and the specific arrangement of the pixels of the array.

Figure 3G:
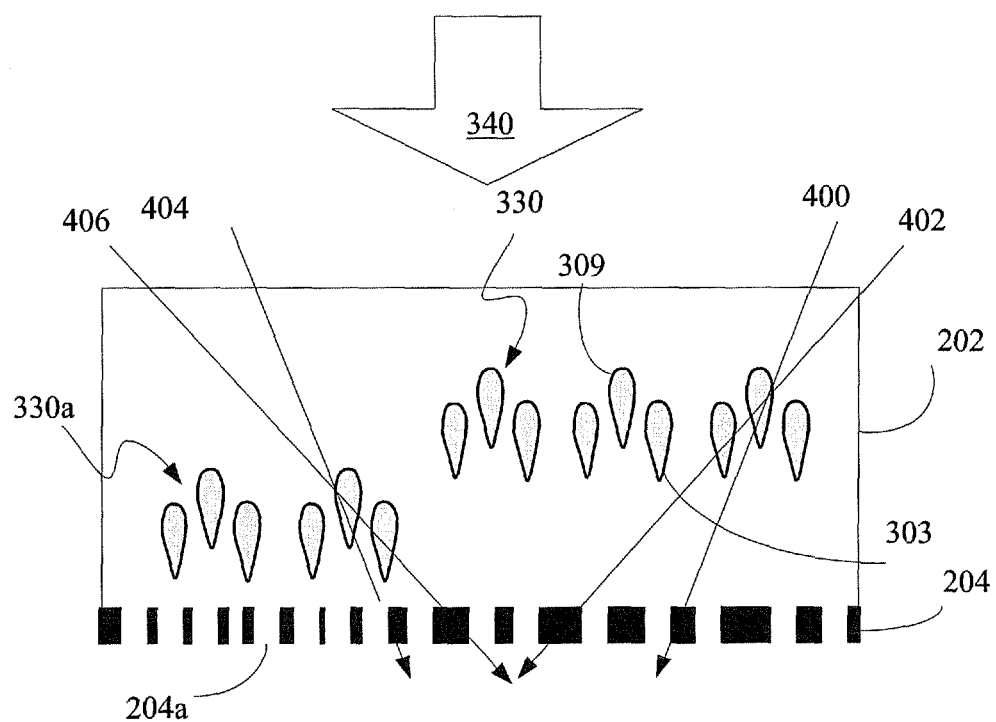
FIG. 3G illustrates a photomask with an array of shading elements where a portion of the array of shading elements is positioned closer to the absorber over a zone of the absorber where a portion of the pattern is densely populated with fine details, according to some embodiments of the present invention.

For many purposes, the array of shading elements may be positioned about the central of the substrate. Typically, in many cases, the shading elements may be positioned some 2500-3500 microns (e.g., 3175 microns, which is half of a typical thickness of a photomask) from the absorber (the patterned coating layer). This arrangement implies that each shading element of the array of shading elements shades different locations of the absorber. This is acceptable and suits its purpose when the details of the pattern on the absorber are varying slowly (low spatial resolution). However, when a greater spatial resolution is required it is suggested to place the shading elements closer to the absorber, to reduce the spatial coverage of each shading element. For example, in some cases some or all of the shading elements of an array of shading elements may be positioned within some tens of microns (e.g., 40-100 microns) from the absorber. This is illustrated in FIG. 3G, illustrating a photomask with an array of shading elements 330. A portion 330a of the array 330 of shading elements is positioned closer to the absorber 204 over a zone 204a of the absorber where a portion of the pattern is densely populated with fine details. In other embodiments of the invention, the entire array of shading elements may be positioned closer to the absorber, when the pattern on the absorber includes fine details.

Figure 5:
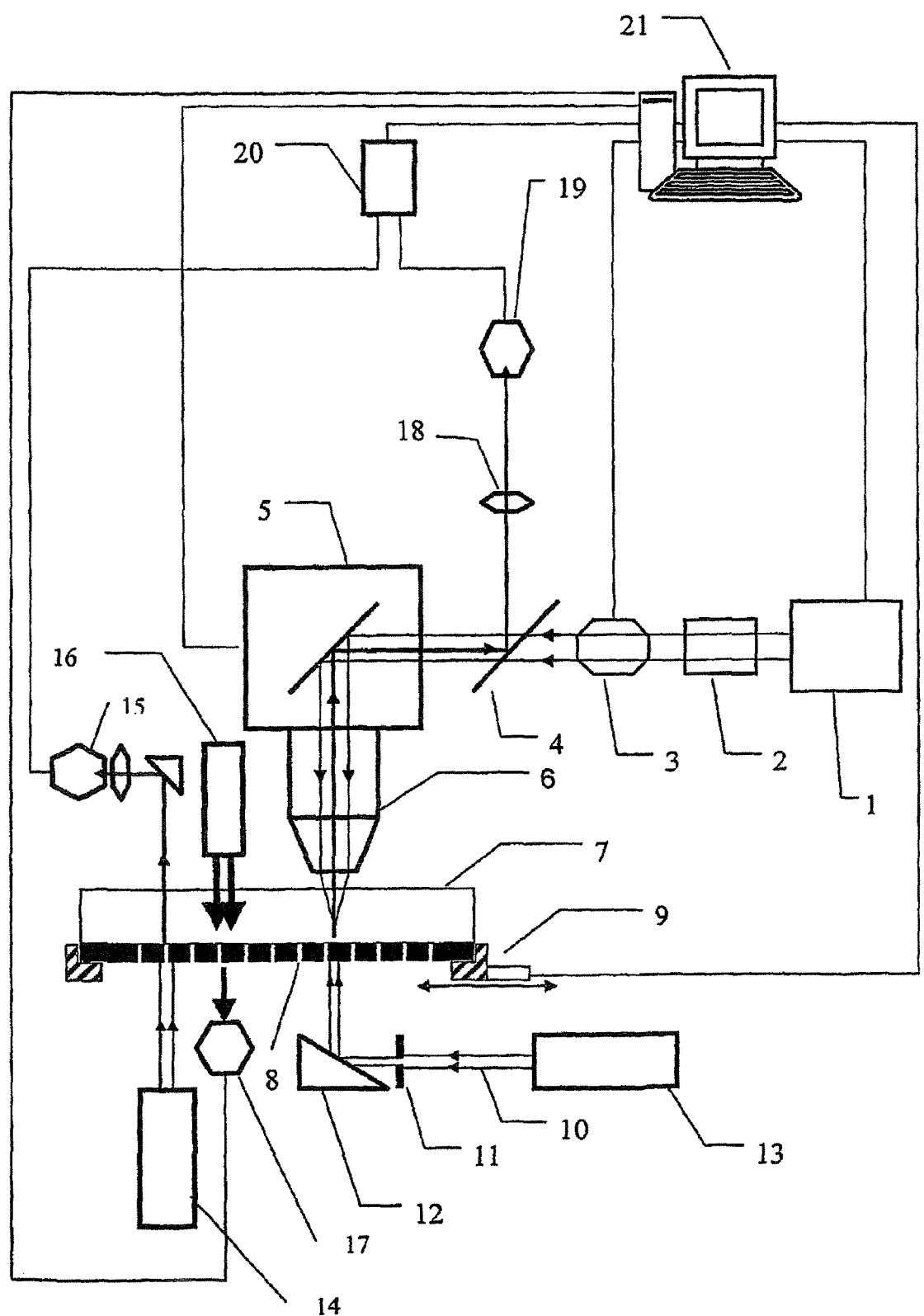
FIG. 5 illustrates a system for manufacturing a direction-selective light attenuator, according to some embodiments of the present invention.

Reference is now made to FIG. 5, illustrating a system for manufacturing a direction-selective light attenuator according to some embodiments of the present invention. A substrate 7 (in this example, a photomask) may be placed on a holder on a movable XYZ stage 9.

The system may include a laser source, such as an ultra-short pulsed femtosecond laser 1, where a central computerized control unit 21 may control the timing of pulses of the light source.

The fundamental frequency of the laser pulse may be multiplied to higher harmonics by a harmonics generator 2, which may be also accompanied by a variable attenuator 3, for controlling output energy.

An attenuated laser beam is directed into a beam delivery system which may include beam shaper and a scanner, such as a galvo-scanner or a piezo-electric actuator type scanner or an acousto-optic deflector 5, which is synchronized with laser pulses timing and with a 3-axis moving stage 9, by the central computerized control unit 21.

Subsequently the beam is focused by a focusing optics (e.g. main objective lens 6) into the substrate of the photomask 7, to write within the substrate an array of shading elements having a direction-selective attenuation property, according to some embodiments of the present invention.

The same objective lens 6 may be used for an in-situ machine vision system, which acts as a microscope with high magnification. This microscope can be used for measuring pixel size and shape as well as monitoring of the laser breakdown process inside the substrate. It may also be used for accurately positioning the shading elements relative at designated locations within the substrate.

The photomask is illuminated by a light source 13 via a light guide 10, and a variable aperture stop 11.

Pixels areas, shape and position are chosen to match the numerical aperture and illumination mode of the lithographic process, for which eventually the photomask is used.

Light may be collimated via a condenser lens onto the patterned layer 8 of the photomask.

An image is eventually formed via objective 6, beam-splitter 4, and a tube-lens 18, which directs the light to CCD camera 19.

An image may be grabbed by a continuous frame-grabber 20, and processed at central computerized control unit 21.

A UV source 16 and detection system 17 measures and reads the UV irradiation attenuation level of each shading area patterned inside the substrate.

An additional imaging system 15 (using light source 14) with low magnification, may be used for navigation across the photomask and for determining coordinates of alignment marks, so CD variation tables which may contain XY alignment coordinates may be loaded to the computer, and match the laser patterning process.

According to some embodiments of the present invention a computational example is given hereinafter.

Local pupil illumination control is related to local intensity control by addition of the incident angle attenuation dependence. This may open few more degrees of freedom that may be important for structured illumination. Furthermore, high spatial resolution control may be obtained that was conceptually impossible before in CDC due to one ray approximation.

In formulating the problem of designing the array of shading elements resulting in a target attenuation a way is hereinafter described that provides a simple computational solution.

In many cases attenuation/scattering of a single pixel and pixel groups it is practically difficult if not impossible to describe analytically thus a numerical matrix description is used, which may be suitable for computational methods.

A simple example of CDC like low spatial resolution process with geometrical approximation for the shading effect and more comprehensive examples of the complex pupil attenuation effect together with scattering effect are considered herein, for the sake of brevity. As an object a standard 6" mask is considered, used in 193 nm microlithography.

Selected shading elements are similar to groups of typical REGC pixels whose dimensions are about 0.8-1.2 µ in x and y and about 3-10 µ in z (x, y and z being orthogonal axes). Illumination types considered are related to standard illumination used in 193 microlithography. Polarization effects are not considered for simplicity.

Computational Approach for Low Spatial Resolution

The fact that every shading element is effecting the illumination of different pattern locations is neglected. This approximation is valid in case of slow variation of the pixel writing density like as in the case of CDC process. This assumption makes computation rather simple. The resulting illumination effect is a linear combination of the contributions of all the shading elements. If N targets of different illumination rays state are considered N different shading elements having linear independent effect are to be provided, corresponding to the N targets. As an example imagine simple quadrupole illumination (see FIG. 3D) and assume it is desired to attenuate the vertical (C, D) pair of poles 1.2 times more intensely than the horizontal pair of poles (A, B). Consider a target 5% attenuation for horizontal dipole (A, B) and 6% for vertical dipole (C, D). In other words, there are two targets for rays (A, B) and (C, D).

Consider writing pixels grouped in the way presented in FIG. 3C. Pixel dimension is bigger than the illumination wavelength and hence a geometrical estimation of the shading effect may be applied. It may be stated that the attenuation of rays C and D (FIG. 3D) is 50% smaller than the attenuation of rays A and B. Let us call this shading element P.

Selecting as a complementary grouping of the pixel the shading element P rotated 90° around z axis, then it will attenuate rays 2 and 3 twice as intensive as rays 3 and 4. Let us call it shading element S. This results in two shading elements providing linear independent effect to the target rays.

Let us say that shading element P with density 1 induces attenuation 1% for rays A, B and 0.5% for rays C, D. Hence the same amount of the writing of shading element S induces 1% attenuation for rays C, D and 0.5% for rays A, B. By solving system of linear equations results in that superposition of 14/3 writing density of shading elements P and 8/3 writing density of shading element S will result in 5% attenuation for rays A, B and 6% attenuation for rays C, D.

Computational Approach for High Spatial Resolution

In many cases a 'spillover' effect has to be considered when the target spatial variation of the desired shading requires resolution finer than the spillover.

Figure 6:
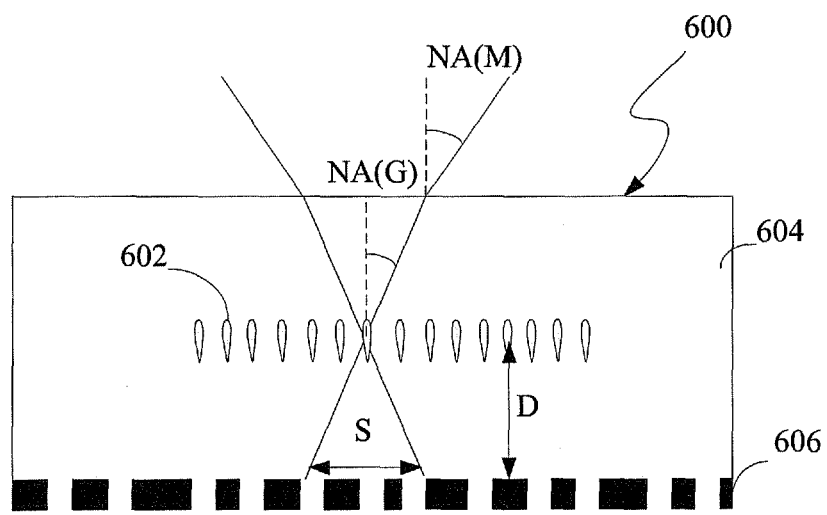
FIG. 6 illustrates a "Spillover" effect of shading by a shading element within a photomask in accordance with some embodiments of the present invention.

Consider FIG. 6, illustrating the "Spillover" effect of shading of a shading element within a photomask 600, made of a transparent substrate 604 whose index of refraction R is 1.5608 (e.g., fused silica, for 193 nm light). An array of shading elements 602 is provided within substrate 604, located substantially in the middle, at a distance D of 3175 nm from the absorber 606 of the photomask.

A single pixel contributes to the creation of a shade that spans across the pattern of the absorber—this is regarded as the "spillover" S. For an illumination level at the wafer (referred to by numerical aperture–NA) of NA(W)=1.35, and illumination level at the photomask of NA(M)=NA(W)/

4=0.34, and where inside the substrate NA(G)=NA(M)/R, the spillover length S is S=2*NA(M)*D/R, which for the given parameters above is calculated to be 1373 nm.

Figure 7:
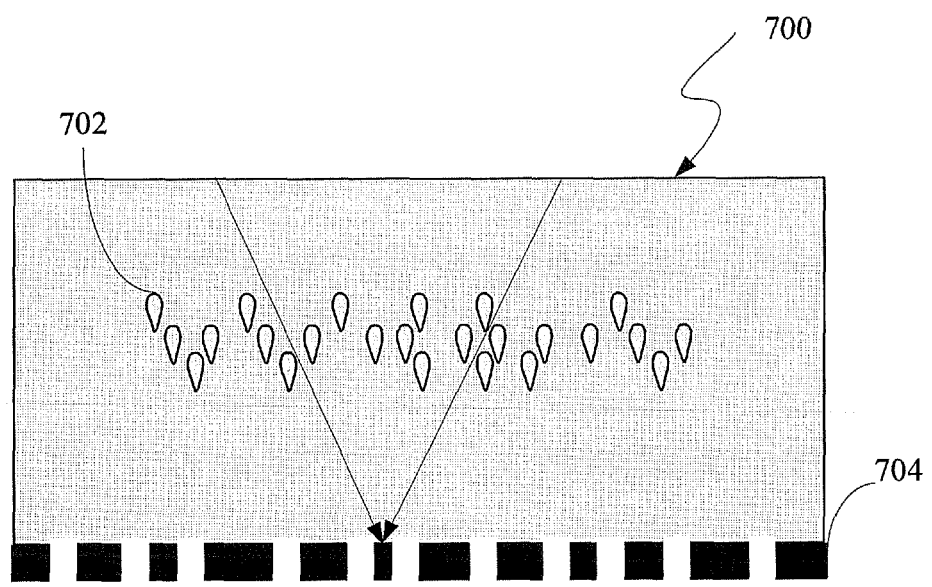
FIG. 7 illustrates the contribution of different parts of the array of shading elements to light attenuation at a specific location on the absorber in accordance with some embodiments of the present invention.

Next, consider FIG. 7, which illustrates the contribution of different parts of an array of shading elements 702 to light attenuation at a specific location on the absorber 704.

The contribution of each pupil ray is multiplied by an effective attenuation of a correspondent pixel location, and these contributions are summed up, as follows:

$$\Delta I(\bar{r}, \bar{p}) = \sum_i I(\bar{p}) A_i(\bar{p}) D_i(\bar{x}(\bar{r}, \bar{p})) \quad (1)$$

Where $\Delta I(r,p)$ is the resulting illumination change, $I(p)$ is the actual pupil illumination intensity, $D_i$ is a density of i type of the pixels, $A_i(p)$ is attenuation of the p ray of the pupil by pixels of i type. In formula (1) p is a pupil coordinate, r is a pattern coordinate and $x(r, p)$ is defined by the geometrical shading $$x(\bar{r},\bar{p}) = \bar{r} + \bar{p} d / \sqrt{1-p^2}$$

where d is the distance of the pixel layer to the pattern.

Figure 8:
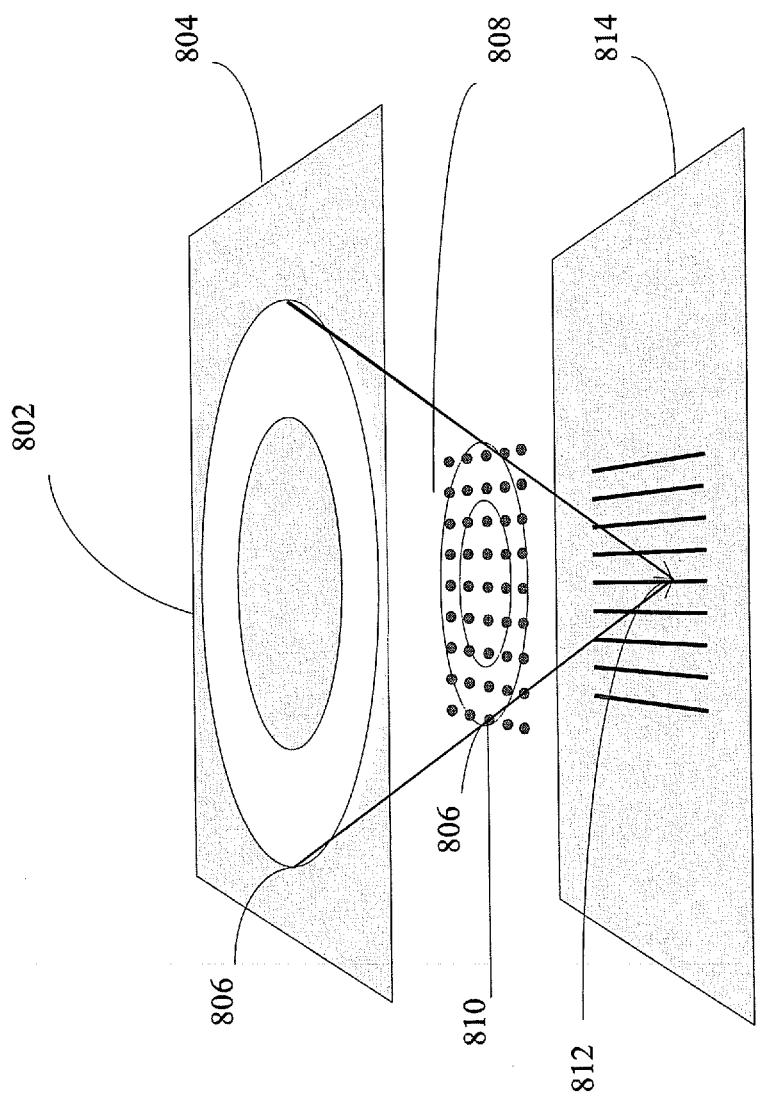
FIG. 8 illustrates a simple geometrical analogy of an attenuation function $A_i(p)$ and convolution in accordance with some embodiments of the present invention.

FIG. 8 illustrates a simple geometrical analogy of the attenuation function $A_i(p)$ and convolution (1). In the example shown in FIG. 8 an annular illumination 802 is presented and system of the shading elements contributing in shade formation of the location. The pupil plane marked as 804. Pixel coordinate $x(r,p)$ is marked as 806. The effective attenuation kernel matrix $A(p)$ is marked as 808. The pixelized plane (where the array of shading elements lies) is marked as 810. Pattern coordinate r is marked as 812. The pattern plane is marked as 814.

The inverse problem is formulated as a definition of the pixel densities $D_i$ s giving resulting illumination change for a given attenuation function $A_i(p)$. Mathematically the exact solution of the problem for a required target $\Delta I_t(r,p)$ might not exist. Thus the best solution giving results close to the target is sought for.

$$D_i(\bar{x}) : \min\{\Phi(D_i)\} \quad (2)$$

$$\Phi(D_i) = \int_R \int_P \left( \Delta I_t(\bar{r}, \bar{p}) - \sum_i I(\bar{p}) A_i(\bar{p}) D_i(\bar{x}(\bar{r}, \bar{p})) \right)^2 d\bar{p} d\bar{r}$$

A solution for problem (2) can be found using different methods. For simplicity a method of the conjugate gradients for linear optimization is considered. To use computational methods a required spatial resolution at the pixel layer may be selected. This automatically defines pupil plane resolution as x and y pupil grid has to be matched with x and y computation grid at the pattern level. The matching is described by the geometrical projection $x(r,p)$ that is defined above. Target $\Delta I_t(r,p)$ is taken to be a set of the matrices for every selected pupil ray or their combinations described by selector matrices. Pupil function $I(p)$ is also presented as a matrix and defined by pupil illumination type, in this approximation it is assumed that the pupil function does not depend on the pattern location (uniform illumination). Attenuation profile $A_i$ for writing mode i can be measured or simulated and also presented as a matrix. In this formulation a set of matrices $D_i$ may be built, that minimizes target functional $\Phi$.

This may be demonstrated by a simple example. Imagine that it is desired to control only two sets of rays of all the pupil rays. These may be presented as selector matrices in the pupil plane (Pupil selector A and B). Imagine that the target is to have an attenuation step for selector A and constant for selector B. Imagine that a couple combinations of the pixel shading elements are provided that attenuate the original pupil so that two different resulting pupil profiles 1 and 2 may be obtained. Then by solving problem (2) the best pixel writing density map 1 and map 2 may be obtained, giving resulting shade for selector A and selector B.

Figure 9:
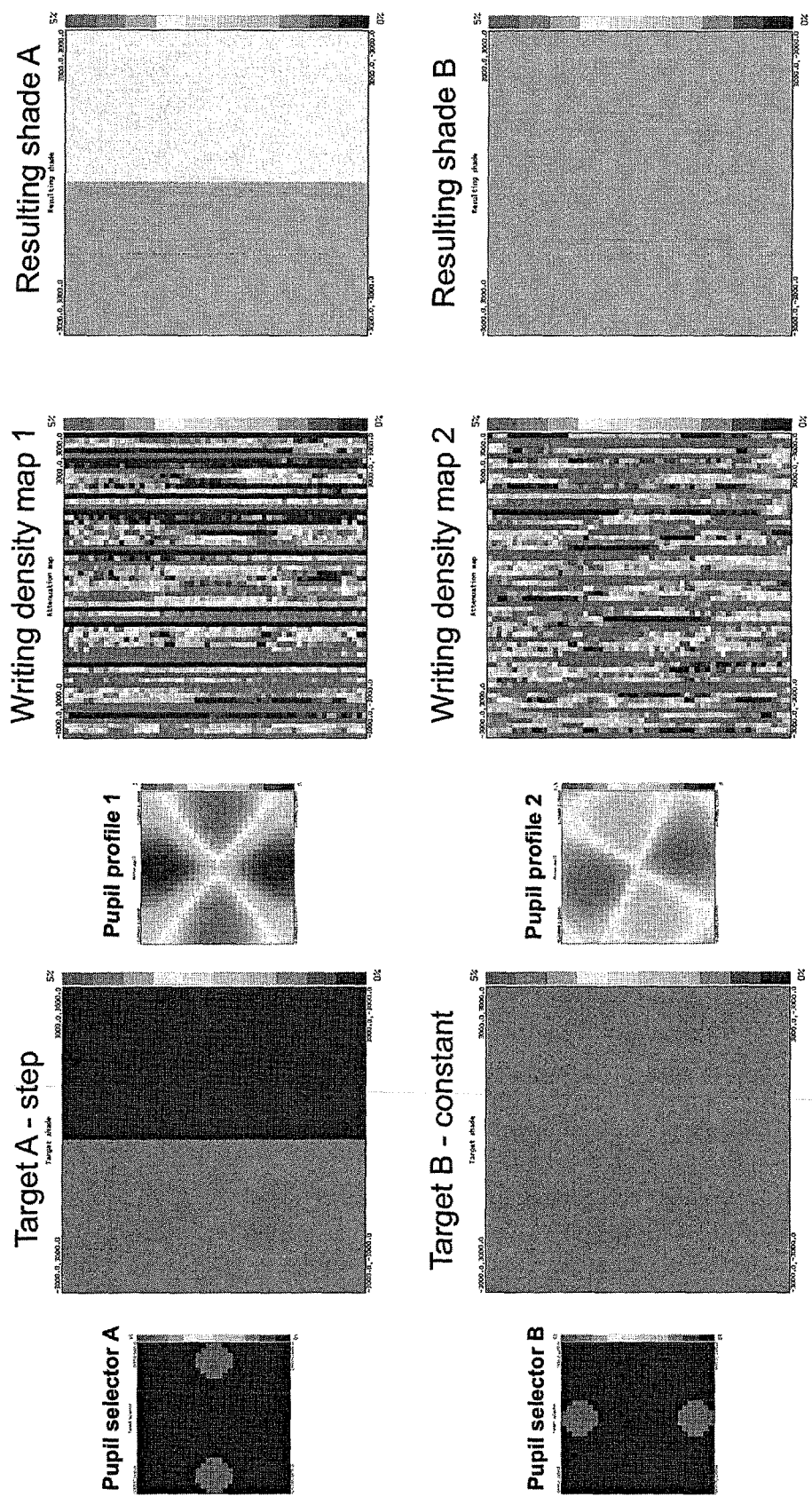
FIG. 9 illustrates for two pupil selectors with given targets, the pupil profiles, writing density maps and resulting shades, according to some embodiments of the present invention.

We may mitigate constraint of the negative writing density by permission of the problem biasing. FIG. 9 illustrates for two pupil selectors with given targets, the pupil profiles, writing density maps and resulting shades, according to some embodiments of the present invention.

The pixel density map 1 and map 2 provide for a resulting shade profile practically identical to the target but biased to a 3% value.

In the above discussion it was assumed that the contribution of the light scattering can be neglected and pure light attenuation dominates. In many cases this assumption cannot be made as is not accurate enough.

If it is considered that pixels not only attenuate light by scattering out of the projection pupil but also scatter some of the light to different pupil directions equation (1) needs adding of an integral component $$\Delta I(\bar{r}, \bar{p}) = \sum_i I(\bar{p}) A_i(\bar{p}) D_i(\bar{x}(\bar{r}, \bar{p})) + \sum_i \int I(\bar{p}') D_i(\bar{x}(\bar{r}, \bar{p}')) S_i(\bar{p}, \bar{p}') d\bar{p}' \quad (3)$$

where again the inverse problem requires defining a density function $D_i(x)$ that for given pupil intensity, attenuation function $A_i$ and given scattering function $S_i(p,p')$ gives closest change of the illumination function to the required change.

$$D_i(\bar{x}) : \min\{\Phi(D_i)\} \quad (4)$$

$$\Phi(D_i) = \int_P \left( \begin{array}{c} \Delta I_t(\bar{r}, \bar{p}) - \sum_i I(\bar{p}) A_i(\bar{p}) D_i(\bar{x}(\bar{r}, \bar{p})) - \\ \sum_i \int_P I(\bar{p}') D_i(\bar{x}(\bar{r}, \bar{p}')) S_i(\bar{p}, \bar{p}') d\bar{p}' \end{array} \right)^2 d\bar{p}$$

Scattering operator $S(p,p')$ cannot be derived using analytical equations as the exact shape of the pixel and gradient of the refractive index through the pixel body is not possible to sample.

Figure 10:
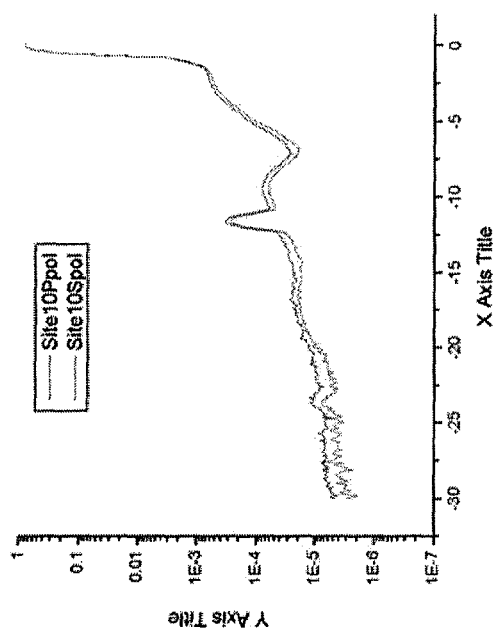
FIG. 10 illustrates an example of a scattering diagram for a pupil ray according to some embodiments of the present invention.

FIG. 10 illustrates an example of a scattering diagram for a pupil ray according to some embodiments of the present invention. For simplification of the example it may be assumed that scattering operator $S(p,p')$ depends only on the difference (p-p') and can be approximated by a Gaussian function.

Figure 11:
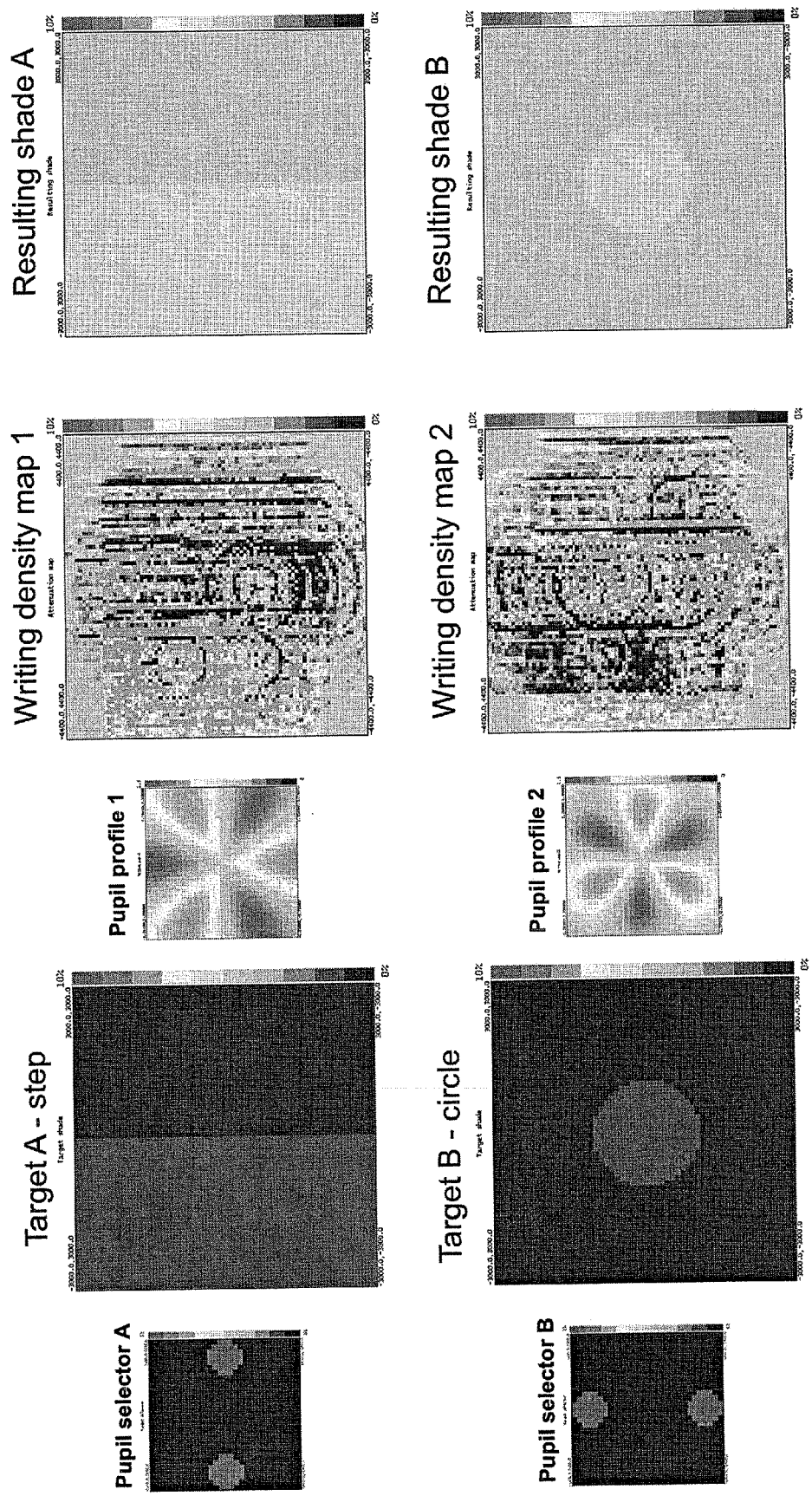
FIG. 11 illustrates for two pupil selectors with given targets, the pupil profiles, writing density maps and resulting shades, according to some embodiments of the present invention, where it is desired to have circular shade.

To demonstrate a wide spectrum of options a circle is as a second target and threefold pupil attenuation function—see FIG. 11.

FIG. 11 illustrates for two pupil selectors with given targets, the pupil profiles, writing density maps and resulting shades, according to some embodiments of the present invention, where it is desired to have circular shade.

In case of a polarized illumination polarization dependent attenuation and scattering matrix operator are introduced.

$$\Delta I_t(\bar{r}, \bar{p}) = \sum_i I_t(\bar{p})A_i^t(\bar{p})D_i(\bar{x}(\bar{r}, \bar{p})) + \sum_{tt'}\int_P I_{t'}(\bar{p}')D_i(\bar{x}(\bar{r}, \bar{p}'))S_i^{tt'}(\bar{p}, \bar{p}')d\bar{p}' \quad (5)$$

$$D_i(\bar{x}): \min\{\Phi(D_i)\} \quad (6)$$

$$\Phi(D_i) = \sum_t \int_P \left( \frac{\Delta I_t(\bar{p}) - \sum_i I_t(\bar{p})A_i(\bar{p})D_i(\bar{x}(\bar{r}, \bar{p})) -}{\sum_{tt'}\int_P I_{t'}(\bar{p}')D_i(\bar{x}(\bar{r}, \bar{p}'))S_i^{tt'}(\bar{p}, \bar{p}')d\bar{p}'} \right)^2 d\bar{p}$$

Some embodiments of the present invention are disclosed and discussed herein. Features of certain embodiments may be combined with features of other embodiments; thus certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for imparting direction-selective light attenuation to a photomask, the method comprising:
    assigning different attenuation levels to light rays of different directions of incidence;
    computing an array of shading elements to attenuate the light rays with the assigned different attenuation levels, depending on the direction of incidence of the light rays; and
    inscribing the array of shading elements within a substrate of the photomask.

2. The method of claim 1, wherein the different directions of incidence are different azimuthal directions.

3. The method of claim 1, wherein the different directions of incidence comprise different angles of incidence on the photomask.

4. The method of claim 1, wherein the array of shading elements is designed to present different scattering cross sections to the incident rays of light of different directions.

5. The method of claim 1, wherein one or a plurality of characteristics of the array of shading elements locally varies across the array of shading elements.

6. The method of claim 5, wherein said one or a plurality of characteristics of the array of shading elements is selected from the group of characteristics consisting of pixel size, shape, pixel orientation, pixel density of the array, and arrangement of the shading elements in the array.

7. The method of claim 1, wherein the array of shading elements comprises at least two shifted substantially parallel two-dimensional formations of shading elements.

8. The method of claim 7, wherein said at least two shifted substantially parallel two-dimensional formations of shading elements comprises three two-dimensional formations of shading elements.

9. The method of claim 8 wherein said three two-dimensional formations of shading elements comprises two external two-dimensional formations of shading elements and a third two-dimensional formation of shading elements in between the external formations, and wherein the two external formations are substantially aligned whereas the third formation is shifted with respect to the two external formations.

10. The method of claim 7, wherein said at least two shifted substantially parallel two-dimensional formations of shading elements are shifted with respect to each other.

11. The method of claim 7, wherein the shading elements of said two-dimensional formations are substantially asymmetrical, in which the asymmetrical formations are configured to provide different shading effects to a first incident ray and a second incident ray that have different directions of incidence and a same angle of incidence measured with respect to a direction normal to a surface of the photomask.

12. The method of claim 1, wherein some or all of the shading elements of the array of shading elements are positioned within 40 to 100 microns from a patterned coating layer on the substrate.

13. An apparatus for imparting direction-selective light attenuation to a photomask, the apparatus comprising:
    a laser source;
    a beam delivery system and focusing optics; and
    a control unit configured to:
        using the laser source, beam delivery system and focusing optics, inscribing an array of shading elements within a substrate of the photomask, wherein the array of shading elements is configured to attenuate the light rays in different attenuation levels, depending on the direction of incidence of the light rays.

14. The apparatus of claim 13, wherein the different directions comprise different azimuthal directions.

15. The apparatus of claim 13, wherein the different directions comprise different angles of incidence.

16. The apparatus of claim 13, wherein the array of shading elements is designed to present different scattering cross section to rays of light of different directions.

17. The apparatus of claim 13, wherein one or a plurality of characteristics of the array of shading elements locally varies across the array of shading elements.

18. The apparatus of claim 17, wherein said one or a plurality of characteristics of the array of shading elements is selected from the group of characteristics consisting of pixel size, shape, pixel orientation, pixel density of the array, and arrangement of the shading elements in the array.

19. The apparatus of claim 13, wherein the array of shading elements comprises at least two shifted substantially parallel two-dimensional formations of shading elements.

20. The apparatus of claim 19, wherein said at least two shifted substantially parallel two-dimensional formations of shading elements comprises three two-dimensional formations of shading elements.

21. The apparatus of claim 20, wherein said three two-dimensional formations of shading elements comprises two external two-dimensional formations of shading elements and a third two-dimensional formation of shading elements in between the external formations, and wherein the two external formations are substantially aligned whereas the third formation is shifted with respect to the two external formations.

22. The apparatus of claim 19, wherein said at least two shifted substantially parallel two-dimensional formations of shading elements are shifted with respect to each other.

23. The apparatus of claim 21, wherein the shading elements of said two-dimensional formations are substantially asymmetrical, in which the asymmetrical formations are configured to provide different shading effects to a first incident ray and a second incident ray that have different directions of incidence and a same angle of incidence measured with respect to a direction normal to a surface of the photomask.

24. The apparatus of claim 13, wherein some or all of the shading elements of the array of shading elements are positioned within 40 to 100 microns from a patterned coating layer on the substrate.

25. A photomask comprising a transparent substrate with an array of shading elements within the substrate, wherein the array of shading elements is configured to selectively attenuate light rays in different attenuation levels, depending on the direction of incidence of the light rays.

26. The photomask of claim 25, wherein the different directions comprise different azimuthal directions.

27. The photomask of claim 25, wherein different directions comprise different angles of incidence.

28. The photomask of claim 25, wherein the predetermined arrangement of the array of shading elements is designed to present different scattering cross section to rays of light of different directions.

29. The photomask of claim 25, wherein one or a plurality of characteristics of the array of shading elements locally varies across the array of shading elements.

30. The photomask of claim 29, wherein said one or a plurality of characteristics of the array of shading elements is selected from the group of characteristics consisting of pixel size, shape, pixel orientation, pixel density of the array, and arrangement of the shading elements in the array.

31. The photomask of claim 25, wherein the array of shading elements comprises at least two shifted substantially parallel two-dimensional formations of shading elements.

32. The photomask of claim 31, wherein said at least two shifted substantially parallel two-dimensional formations of shading elements comprises three two-dimensional formations of shading elements.

33. The photomask of claim 32 wherein said three two-dimensional formations of shading elements comprises two external two-dimensional formations of shading elements and a third two-dimensional formation of shading elements in between the external formations, and wherein the two external formations are substantially aligned whereas the third formation is shifted with respect to the two external formations.

34. The photomask of claim 31, wherein said at least two shifted substantially parallel two-dimensional formations of shading elements are shifted with respect to each other.

35. The photomask of claim 31, wherein the shading elements of said two-dimensional formations are substantially asymmetrical, in which the asymmetrical formations are configured to provide different shading effects to a first incident ray and a second incident ray that have different directions of incidence and a same angle of incidence measured with respect to a direction normal to a surface of the photomask.

36. The photomask of claim 25, wherein some or all of the shading elements of the array of shading elements are positioned within 40 to 100 microns from a patterned coating layer on the substrate.

* * * * *

UNITED STATES PATENT AND TRADEMARK OFFICE
CERTIFICATE OF CORRECTION

PATENT NO. : 10,114,294 B2
APPLICATION NO. : 15/453337
DATED : October 30, 2018
INVENTOR(S) : Vladimir Dmitriev It is certified that error appears in the above-identified patent and that said Letters Patent is hereby corrected as shown below:

In the Specification

Column 6
Line 39, delete "directed" and insert -- directed. --

Column 7
Line 32, delete "attenuation" and insert -- attenuation. --

Column 11
Line 47, delete "pixel" and insert -- pixel. --

Column 17
Lines 9-14 (Approx.), delete "
$$\Phi(D_i) = \sum_t \int_P \left( \frac{\Delta I_t(\bar{p}) - \sum_i I_t(\bar{p}) A_i(\bar{p}) D_i(\bar{x}(\bar{r}, \bar{p})) -}{\sum_{it'} \int_P I_{t'}(\bar{p}') D_i(\bar{x}(\bar{r}, \bar{p}')) S_i^{tt'}(\bar{p}, \bar{p}') d\bar{p}'} \right)^2 d\bar{p}$$
"

and insert --
$$\Phi(D_i) = \sum_t \int_P \left( \frac{\Delta I_t(\bar{p}) - \sum_i I_t(\bar{p}) A_i(\bar{p}) D_i(\bar{x}(\bar{r}, \bar{p})) -}{\sum_{it'} \int_P I_t(\bar{p}') D_i(\bar{x}(\bar{r}, \bar{p}')) S_i^{tt'}(\bar{p}, \bar{p}') d\bar{p}'} \right)^2 d\bar{p}$$
--

Signed and Sealed this
Eighth Day of January, 2019

Andrei Iancu
*Director of the United States Patent and Trademark Office*